US006320446B1

(12) United States Patent
Podlesny et al.

(10) Patent No.: US 6,320,446 B1
(45) Date of Patent: Nov. 20, 2001

(54) SYSTEM FOR IMPROVING LOW VOLTAGE CMOS PERFORMANCE

(75) Inventors: Andrew V. Podlesny; Alexander V. Malshin, both of Moscow (RU)

(73) Assignee: Elbrus International Limited, George Town Grand Caymen (KY)

( * ) Notice: Subject to any disclaimer, the term of this patent is extended or adjusted under 35 U.S.C. 154(b) by 0 days.

(21) Appl. No.: 09/504,573

(22) Filed: Feb. 15, 2000

Related U.S. Application Data
(60) Provisional application No. 60/120,449, filed on Feb. 17, 1999.

(51) Int. Cl.[7] ......................................................... H03L 5/00
(52) U.S. Cl. .................................................................. 327/333
(58) Field of Search .............................. 326/88, 92, 113; 327/319, 333, 374, 376, 390, 536

(56) References Cited

U.S. PATENT DOCUMENTS

| 5,467,032 | * | 11/1995 | Lee .......................................... 326/88 |
| 5,486,774 | | 1/1996 | Douseki et al. ........................ 326/33 |
| 5,594,371 | | 1/1997 | Douseki ................................. 326/119 |
| 6,140,837 | * | 10/2000 | Eaton et al. ............................ 326/38 |
| 6,160,437 | * | 12/2000 | Kim et al. .............................. 327/408 |
| 6,163,199 | * | 12/2000 | Miske et al. .......................... 327/434 |
| 6,177,824 | * | 1/2001 | Amanai ................................. 327/333 |

OTHER PUBLICATIONS

Shin'ichiro Mutoh, et al., *1–V Power Supply High–Speed Digital Circuit Technology with Multithreshold–Voltage CMOS*, IEEE Journal of Solid–State Circuits, vol. 30, No. 8, Aug. 1995, pp. 847–854.
Daniel W. Dobberpuhl, et al., *A 200–MHz 64–b Dual–Issue CMOS Microprocessor*, IEEE Journal of Solid–State Circuits, vol. 27, No. 11, Nov. 1992, pp. 1555–1567.
William J. Bowhill, et al., *Circuit Implementation of a 300–MHz 64–bit Second–generation CMOS Alpha CPU*, Digital Technical Journal, vol. 7, No. 1, 1995, pp. 100–118.
Shin'ichiro Mutoh, et al., *1–V High–Speed Digital Circuit Technology with 0.5 μm Mutli–Threshold CMOS*, IEEE 1993, pp. 186–189.
Satoshi Shigematsu, et al., *A 1–V High–Speed MTCMOS Circuit Scheme for Power–Down Applications*, 1995 Symposium of VLSI Circuits Digest of Technical Papers, pp. 125–126.
Takakuni Douseki, et al., *A 0.5V SIMOX–MTCMOS Circuit with 200ps Logic Gate*, 1966 IEEE International Solid–State Circuits Conference, Session 5, Paper TP 5.4, pp. 84–85.
Tomio Nakano, et al., *A Sub–100 ns 256K DRAM with Open Bit Line Scheme*, IEEE Journal of Solid–State Circuits, vol. SC–18, No. 5, October 1983, pp. 452–456.
Takashima, et al., *Standby/Active Mode Logic for Sub–1–V Operating ULSI Memory*, IEEE Journal of Solid–State Circuits, vol. 29, No. 4, pp. 441–447, Apr. 1994.
Keith Diefendorff, Microprocessor Report, The Insiders' Guide to Microprocessor Hardware, *The Russians Are Coming, Supercomputer Maker Elbrus Seeks to Join x86/IA–64 Melee*, Feb. 15, 1999, vol. 13, No. 2, pp. 1–7.

* cited by examiner

*Primary Examiner*—Jeffrey Zweizig
(74) *Attorney, Agent, or Firm*—Townsend and Townsend and Crew LLP

(57) ABSTRACT

A system for increasing the speed and noise immunity of signals transmitted in low voltage CMOS applications. The system includes a transmission device for transmitting a signal in a CMOS circuit, wherein the CMOS circuit includes a high voltage power supply and a low voltage power supply and the signal is transmitted between first and second portions of the CMOS circuit that are coupled to the low voltage power supply. The transmission device comprises a transistor having a gate, drain and source terminals, wherein the drain terminal is coupled to the first portion of the CMOS circuit to receive the signal, and the source terminal is coupled to the second portion of the CMOS circuit and a gate controller coupled to the high voltage power supply and providing a gate control signal coupled to the gate terminal, wherein the gate controller may provide a level approximately equal to the high voltage power supply to the gate terminal via the gate control signal, so that the transistor connects the drain and source terminals.

5 Claims, 4 Drawing Sheets

SYSTEM FOR IMPROVING LOW VOLTAGE CMOS PERFORMANCE

CROSS-REFERENCES TO RELATED APPLICATIONS

This application claims priority from U.S. Provisional Patent Application No. 60/120,449 filed on Feb. 17, 1999, the disclosure of which is incorporated herein in its entirety for all purposes.

FIELD OF THE INVENTION

This invention relates to the operation of low voltage CMOS circuitry, and more particularly, to the transmission of low voltage CMOS signals through pass-transistor logic.

BACKGROUND OF THE INVENTION

In conventional pass-transistor circuits, where the pass-transistor includes a gate, drain and source terminal, the gate and drain high logic levels are equal to the power supply voltage. Under these conditions the source high logic level is reduced by the MOS threshold voltage Vt. This results in decreasing the noise margin and speed of the pass-transistor stage. Moreover, when a load capacitance connected to the source is charged, the effective control voltage decreases from a maximum value to zero and the drain-to-source resistance increases from a minimum value to the infinity. This substantially increases the low-high delay of the pass-transistor stage. Attempts to increase speed by means of decreasing pass threshold leads to increasing the subthreshold leakage current, thereby increasing the power consumption. This also decreases the discharge time when operating in a dynamic mode.

SUMMARY OF THE INVENTION

The present invention includes a system for increasing the speed and noise immunity of signals transmitted in low voltage CMOS (LVCMOS) applications by means of high voltage controlled pass transistor logic.

In an embodiment of the present invention, a transmission device for transmitting a signal in a CMOS circuit is provided, wherein the CMOS circuit includes a high voltage power supply and a low voltage power supply and the signal is transmitted between first and second portions of the CMOS circuit that are coupled to the low voltage power supply. The transmission device comprises a transistor having a gate, drain and source terminals, wherein the drain terminal is coupled to the first portion of the CMOS circuit to receive the signal, and the source terminal is coupled to the second portion of the CMOS circuit and a gate controller coupled to the high voltage power supply and providing a gate control signal coupled to the gate terminal, wherein the gate controller may provide a level approximately equal to the high voltage power supply to the gate terminal via the gate control signal, so that the transistor connects the drain and source terminals.

DESCRIPTION OF THE SPECIFIC EMBODIMENTS

The present invention includes a method for improving the speed and noise immunity for LVCMOS circuits having two voltage supplies. For example, a low voltage supply for core circuitry and a high voltage supply for periphery and support circuitry.

Figure 1:
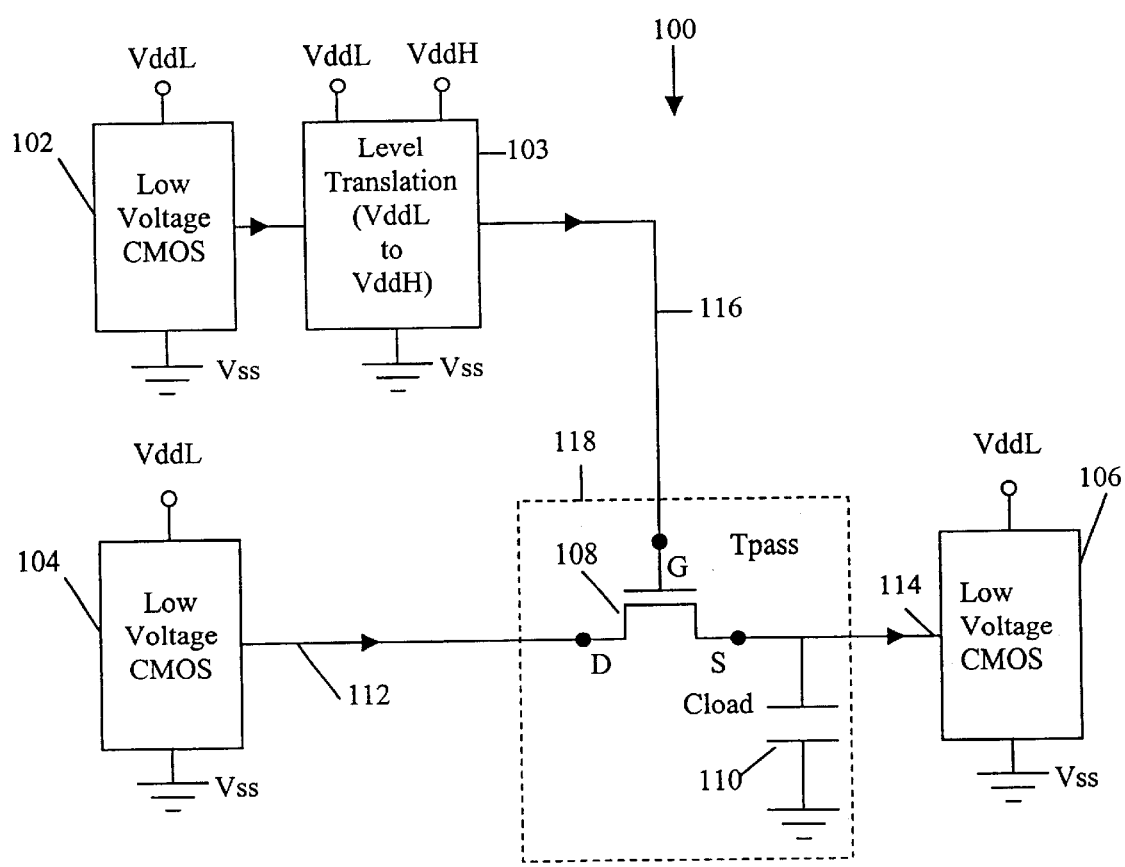
FIG. 1 shows a circuit constructed in accordance with the present invention.

FIG. 1 shows a diagram of a circuit 100 constructed in accordance with the present invention. The circuit 100 includes a first low voltage CMOS logic section 102, a second low voltage CMOS logic section 104 and a third low voltage CMOS logic section 106. The circuit 100 also includes a pass-transistor logic section 118 which has an NMOS pass transistor 108 and a load capacitor (Cload) 110. A level translation circuit 103 translates logic levels from the first low level CMOS logic section 102 (where a high level=Vddl) to high level logic (where a high level=Vddh).

The low voltage logic sections 102, 104 and 106 are coupled to a low voltage supply (Vddl), wherein Vddl is less than or equal to approximately 1 volt. The logic sections 102, 104 and 106 are also coupled to a system ground (Vss). The high voltage of the logic section 103 is coupled to a high voltage supply (Vddh), wherein Vddh is in the approximate range of 3 to 5 volts. The logic section 103 is also coupled to Vddl and Vss.

The NMOS pass-transistor 108 is coupled to receive an input signal 112 at a drain D terminal from the low voltage section 104, and is further coupled to an output signal 114 at a source S terminal to the low voltage logic section 106. A gate G terminal of the transistor 108 is coupled to a gate control 116 of the level translation section 103.

During operation of the circuit 100, the NMOS pass-transistor 108 is coupled to transfer from drain D to source S logic levels from the first low voltage section 104 to the second low voltage section 106. For example, a low voltage logic level (Vd,l) may be equivalent to system ground Vss so that (Vd,l=Vss). A high voltage logic level (Vd,h) may be equivalent to Vddl so that (Vd,h=Vddl). The gate G controls activation of the pass transistor 108 and is controlled by the gate control logic levels. For example, a low gate control level (Vg,l) may be equivalent to system ground Vss so that (Vg,l=Vss), and a high gate control level (Vg,h) may be equivalent to Vddh so that (Vg,h=Vddh). Therefore it is possible that the gate G may have a logic level (Vg,h) that is higher than logic levels at either the drain D or source S, which may have high levels of Vddl.

To activate the pass transistor 108 a transistor voltage threshold Vt must be exceeded. Therefore, if [(Vddh−Vddl) >Vt] then the transistor 108 will be activated at any drain logic state and voltage levels at the source S will be the same as at the drain D. For example, a low source voltage (Vs,l) will be equivalent to system ground so that (Vs,l=Vss) and a high source voltage (Vs,h) will be equivalent to Vddl so that (Vs,h=Vddl). As a result, the noise margin and speed of the logic signals passing through the pass-transistor 108 to the next stage (shown as second logic 106) will be improved as explained below.

The pass transistor 108 drain-to-source delay is dependent on an effective control voltage (Vcontr,eff). The Vcontr,eff can be expressed as:

$$V_{contr,eff} = V_{gs} - V_t$$

The time delay (tdelay) of the transistor 108 can be expressed as:

$$tdelay = K*Cload*Vsw/(Vcontr,eff) = K*Cload*Vsw/(Vgs-Vt)$$

where Vsw is the low voltage logic swing, K is a scaling factor, and Cload is the capacitance of capacitor 110.

In one embodiment of the present invention the pass transistor transfers from drain to source a Vsw which can be expressed as:

Vsw=Vddl.

and the gate G is controlled by the high voltage level so that Vgs can be expressed as:

Vgs=Vddh−Vddl

Unlike the conventional pass transistor circuits, in the embodiment of the present invention described above, the Vcontr,eff varies insignificantly from the maximum value (Vddh−Vss−Vt) to the minimum value (Vddh−Vddl−Vt) during the charge of the load capacitance 110. Also, the drain-to-source resistance Rds remains nearly constant and small during charging and discharging of the capacitor 110. This essentially decreases and equalizes the rise and fall delays of signals passing through the pass-transistor 108. Moreover, due to the essential increase of the Vcontr,eff the size of the pass transistor can be optimized, and in particular, decreased, in order to decrease the load capacitances and to increase the speed. Additionally, if the process provides high MOS transconductance and as a consequence a large effective control voltage Vcontr,eff, the pass transistor threshold Vt may be increased thus increasing the discharge time in dynamic node 114 (when pass transistor 108 is switched off) due to the subthreshold leakage current decrease. If Vddh−Vddl>Vt then the high logic levels at the source and at the drain are the same and equal to the low voltage power supply Vddl. As a result, the noise immunity at the high logic level (Vnm,h) for the signals passing through the pass-transistor to the input 114 of the following low voltage CMOS section 106 is maintained as high as for the CMOS logic and can be expressed as:

Vnm,h=Vddl−Vth where the Vth is the input switching voltage level for the CMOS logic 106. In comparison, for conventional circuits using CMOS logic with pass-transistors the noise immunity at the high logic level (Vnm,h) is reduced and can be expressed as:

Vmn,h=Vddl−Vt−Vth

The proposed method is effective in LVCMOS applications for circuitry utilizing two power supply voltages. As a result, several embodiments of the present invention can be implemented based on the particular application.

Figure 2:
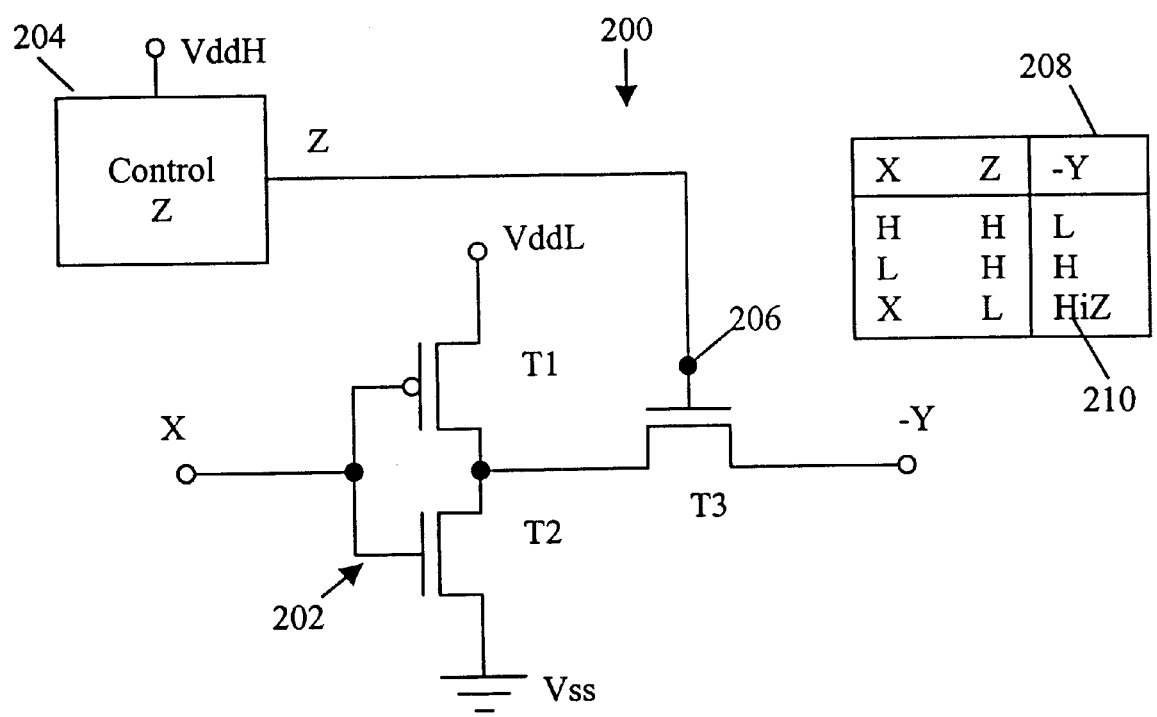
FIG. 2 shows an embodiment of the present invention for implementing a three-state drive.

FIG. 2 shows an embodiment 200 of the present invention for implementing a three-state driver, such as the type that may be used for data bus buffers or signal multiplexers. In the embodiment 200, a pass-transistor T3 is used to pass through signals from an inverter section 202 to the output (−Y). The inverter section 202 is coupled to a low voltage supply (Vddl). The inverter section 202 has a signal X as an input. A controller 204 is coupled to a high voltage supply (Vddh) and provides a control signal Z that is coupled to a gate terminal 206 of the pass-transistor T3. A truth table 208 shows that during operation of the embodiment 200, when signal Z is at a low logic level (Vss), then the output −Y is in the high impedance state, as shown at 210. When the signal Z is at a high logic level (Vddh), then the output −Y is the inverse of the signal X. However, the high voltage level on the gate 206 means that advantages of the embodiment relating to noise immunity and speed of the pass-transistor T3 will be realized.

Figure 3:
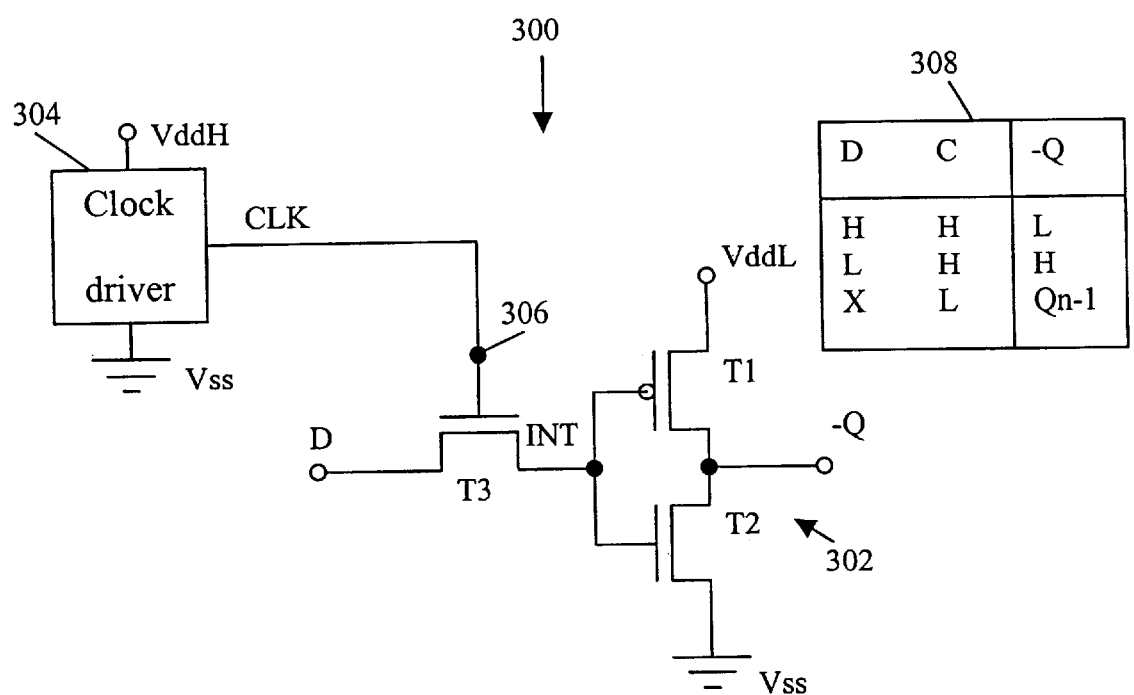
FIG. 3 shows an embodiment of the present invention for implementing a clock circuit for a dynamic latch.

FIG. 3 shows an embodiment 300 of the present invention for clocking a dynamic latch 302. A pass-transistor T3 is coupled between an input D and the latch 302. The dynamic latch 302 is powered by a low voltage power supply (Vddl). A clock driver 304 is coupled to a high voltage power supply (Vddh) and provides a clock signal CLK to a gate terminal 306 of the pass-transistor T3.

A truth table 308 illustrates the operation of the embodiment 300. When the CLK signal is at a high level (Vddh), the output −Q of the latch is the inverse of the input D. Because the gate 306 is driven by a level (Vddh) the advantages of the invention described in previous embodiments is again realized.

Figure 4:
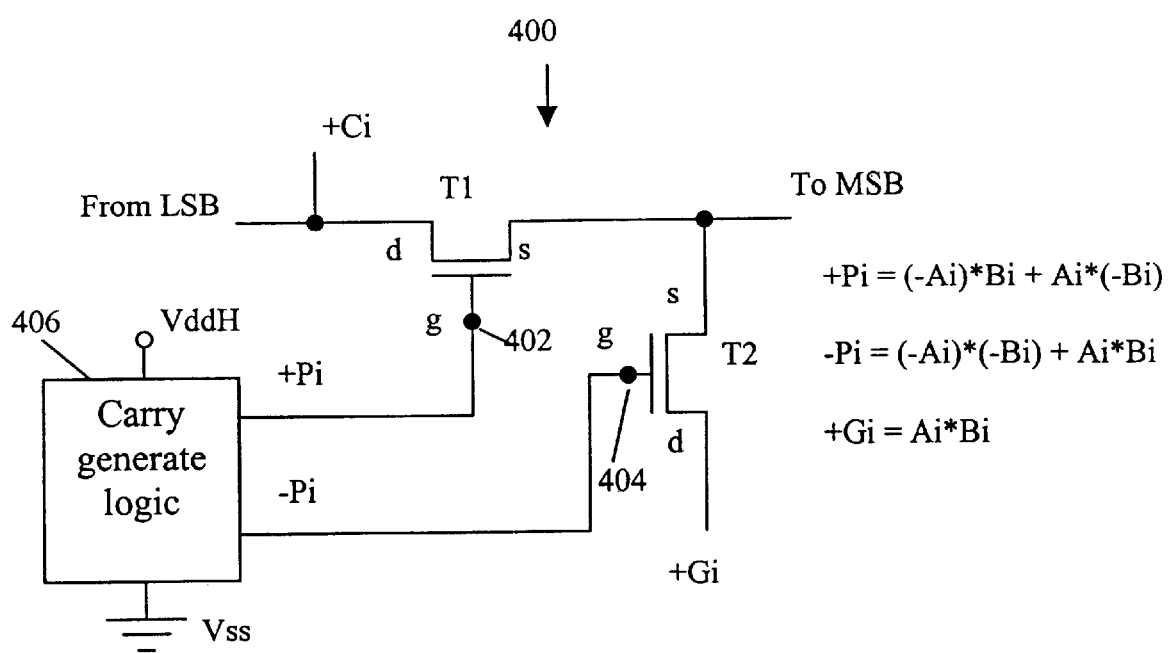
FIG. 4 shows an embodiment of the present invention for implementing an adder carry chain.

FIG. 4 shows an embodiment 400 of the present invention for implementing an adder carry chain. Pass-transistors T1 and T2 are used to pass through adder signals up an adder chain from the least significant bit (LSB) toward the most significant bit (MSB). The gate terminals 402 and 404 of the pass-transistors are coupled to carry generate logic 406. The logic 406 is powered by a high voltage supply (Vddh) so that the gate control signals +Pi and −Pi will be able to provide Vddh to the gates 402 and 404 of the pass-transistors, and thereby allow for increase speed and noise immunity of the adder signals as they proceed up the adder chain through the pass-transistors.

The present invention provides a system for transmitting signals between low voltage CMOS circuitry that achieves high speed and noise immunity. It will be apparent to those with skill in the art that modifications to the above embodiments can occur without deviating from the scope of the present invention. Accordingly, the disclosures and descriptions herein are intended to be illustrative, but not limiting, of the scope of the invention which is set forth in the following claims.

What is claimed is:

1. An improved circuit, the circuit comprising:
   a first low-power CMOS circuit, coupled to a low power supply level and ground, having an output for providing a control signal at either a high level equal to the low power supply level or a low level equal to the ground level;
   a level shifting circuit, coupled to a high power supply level and ground, having an input coupled to receive the control signal and having an output for providing a level-shifted control signal having a high level equal to a high power supply level and a low level equal to the ground level;
   a second low-power CMOS circuit, coupled to the low power supply level and ground, having an output for providing a logic signal at either a high level equal to the low power supply level or a low level equal to a ground level;
   a third low-power CMOS circuit, coupled to a low power supply signal and ground, having an input for receiving the logic signal;
   a pass transistor having gate, drain and source terminals, wherein the drain terminal is coupled to the output of the second low-power CMOS circuit to receive the logic signal, the source terminal is coupled to the input of the third low-power CMOS circuit, and the gate terminal is coupled to the output of the level shifting circuit, with a threshold voltage of the pass transistor being less than the difference between the high and low power supply levels;

where the level shifted control signal has an amplitude that is greater than the low power supply level, so that a large current can flow between the drain terminal and the source terminal, wherein when the logic signal is transmitted between the second low power CMOS circuit and the third low power CMOS circuit a charge time and a discharge time of the parasitic capacitance are minimized.

2. The transmission device of claim 1, wherein the high power supply level has an amplitude from about 3 to about 5 times greater than the low power supply level.

3. The circuit of claim 1 where said circuit is a three-state driver and wherein:

said first low power CMOS circuit and said level shifting circuit form a driver control circuit; and said second low power CMOS circuit is an invertor.

4. The circuit of claim 1 where said circuit is a clock-latching circuit wherein:

said first low power CMOS circuit and said level shifting circuit form a clock driver; and said third low power CMOS circuit is an invertor.

5. The circuit of claim 1 where said circuit implements an adder carry chain wherein:

said first low power CMOS circuit and level shifting circuit form a carry generate logic circuit that generates first and second level-shifted control signals;

said pass transistor has its gate coupled to a first level-shifted control signal;

and further comprising:

a second pass transistor having its gate coupled to the second level-shifted control signals.

* * * * *